(12) United States Patent
Noguchi et al.

(10) Patent No.: US 11,736,197 B2
(45) Date of Patent: Aug. 22, 2023

(54) OPTICAL MODULE

(71) Applicant: CIG Photonics Japan Limited, Kanagawa (JP)

(72) Inventors: Daisuke Noguchi, Tachikawa (JP); Hiroshi Yamamoto, Inagi (JP)

(73) Assignee: CIG PHOTONICS JAPAN LIMITED, Sagamihara (JP)

( * ) Notice: Subject to any disclaimer, the term of this patent is extended or adjusted under 35 U.S.C. 154(b) by 275 days.

(21) Appl. No.: 17/375,411

(22) Filed: Jul. 14, 2021

(65) Prior Publication Data

US 2022/0103262 A1 Mar. 31, 2022

(30) Foreign Application Priority Data

Sep. 25, 2020 (JP) ................. 2020-160832

(51) Int. Cl.
*H04B 10/50* (2013.01)
*H01S 5/026* (2006.01)
(Continued)

(52) U.S. Cl.
CPC ........... *H04B 10/503* (2013.01); *H01L 24/05* (2013.01); *H01L 24/37* (2013.01); *H01L 24/48* (2013.01); *H01S 5/023* (2021.01); *H01S 5/026* (2013.01); *H01S 5/02212* (2013.01); *H05K 1/113* (2013.01); *H05K 1/181* (2013.01); *H01L 2224/37111* (2013.01); *H01L 2224/37144* (2013.01); *H01L 2224/48091* (2013.01);
(Continued)

(58) Field of Classification Search
CPC ....... H04B 10/503; H01S 5/023; H01S 5/026; H01S 5/02212; H01L 24/05; H01L 24/37; H01L 24/48; H01L 2224/37111; H01L 2224/37144; H01L 2224/48091; H01L 2924/30105; H01L 2924/3011; H05K 1/113; H05K 1/181
USPC .......................................... 398/182
See application file for complete search history.

(56) References Cited

U.S. PATENT DOCUMENTS 11,128,101 B2 * 9/2021 Hettler ................. H01S 5/023
2004/0247004 A1 * 12/2004 Keh ..................... H01S 5/0231
372/36

(Continued)

FOREIGN PATENT DOCUMENTS

JP 2019-134056 A 8/2019

*Primary Examiner* — Dalzid E Singh
(74) *Attorney, Agent, or Firm* — Mattingly & Malur, PC

(57) ABSTRACT

An optical module includes: an optical semiconductor device in which a semiconductor laser and an optical modulator are integrated; a bypass capacitor including a lower electrode and an upper electrode, the bypass capacitor being connected in parallel to the semiconductor laser; a dielectric substrate having an upper surface and a lower surface, the optical semiconductor device and the bypass capacitor being surface-mounted on the upper surface, the dielectric substrate having a conductor pattern on the upper surface, the cathode electrode and the lower electrode being bonded to the conductor pattern; and a conductor block supporting the lower surface of the dielectric substrate. The lower electrode of the bypass capacitor having an overlap area overlapping with the upper surface of the dielectric substrate, the lower electrode of the bypass capacitor having an overhang area overhanging from the upper surface of the dielectric substrate.

19 Claims, 16 Drawing Sheets

(51) Int. Cl.
- *H01S 5/023* (2021.01)
- *H01S 5/02212* (2021.01)
- *H05K 1/11* (2006.01)
- *H05K 1/18* (2006.01)
- *H01L 23/00* (2006.01)

(52) U.S. Cl.
CPC ............... *H01L 2924/3011* (2013.01); *H01L 2924/30105* (2013.01)

(56) References Cited

U.S. PATENT DOCUMENTS

| | | | |
|---|---|---|---|
| 2005/0047461 A1* | 3/2005 | Kihara | H01S 5/02212 372/36 |
| 2007/0116472 A1* | 5/2007 | Kim | H04B 10/25891 398/135 |
| 2007/0248363 A1* | 10/2007 | Kagaya | H01S 5/02325 385/2 |
| 2016/0261348 A1* | 9/2016 | Murakami | H04B 10/40 |
| 2017/0133821 A1* | 5/2017 | Kimura | H01S 5/02469 |
| 2019/0237934 A1 | 8/2019 | Adachi et al. | |
| 2020/0192038 A1* | 6/2020 | Noguchi | G02B 6/4248 |
| 2021/0159666 A1* | 5/2021 | Lin | H01S 5/023 |
| 2021/0255406 A1* | 8/2021 | Saeki | H01S 5/0231 |
| 2022/0149591 A1* | 5/2022 | Kanazawa | H01S 5/02325 |

\* cited by examiner

OPTICAL MODULE

CROSS-REFERENCE TO RELATED APPLICATION

The present application claims priority from Japanese patent application JP2020-160832 filed on Sep. 25, 2020, the contents of which are hereby incorporated by reference into this application.

BACKGROUND

1. Field

The disclosure relates to an optical module.

2. Description of the Related Art

Optical modules require not only high speed but also low power consumption. An electro-absorption modulator integrated laser (EML) is suitable for high-speed operation in 50 Gbit/s class. The EML is an optical semiconductor device in which a laser diode (LD) and an electro-absorption (EA) modulator are integrated, and where the LD and the EA modulator share a cathode electrode (JP2019-134056A). Driven by a differential signal pair for low power consumption, the EML deteriorates in waveform quality due to inflow of a modulated electrical signal from the cathode electrode to the LD. To prevent this, a bypass capacitor is connected between an anode and the cathode of the LD.

To mount the bypass capacitor on a substrate by applying surface mounting, an interconnection pattern needs to have a large area, leading to a lower characteristic impedance and a lower waveform quality.

SUMMARY

The disclosure aims at suppressing a decrease in a characteristic impedance.

(1) An optical module includes: an optical semiconductor device in which a semiconductor laser and an optical modulator are integrated, the optical semiconductor device including an anode electrode of the semiconductor laser and an anode electrode of the optical modulator, the optical semiconductor device including a cathode electrode common to the semiconductor laser and the optical modulator; a bypass capacitor including a lower electrode and an upper electrode, the bypass capacitor being connected in parallel to the semiconductor laser; a dielectric substrate having an upper surface and a lower surface, the optical semiconductor device and the bypass capacitor being surface-mounted on the upper surface, the dielectric substrate having a conductor pattern on the upper surface, the cathode electrode and the lower electrode being bonded to the conductor pattern; and a conductor block supporting the lower surface of the dielectric substrate. The lower electrode of the bypass capacitor has an overlap area overlapping with the upper surface of the dielectric substrate, the lower electrode of the bypass capacitor having an overhang area overhanging from the upper surface of the dielectric substrate.

The dielectric substrate is not interposed between the overhang area of the lower electrode of the bypass capacitor and the conductor block. This can make a parasitic capacitance smaller, thereby suppressing a decrease in a characteristic impedance.

(2) In the optical module according to (1), the conductor pattern may include a bonding portion bonded to the cathode electrode, the conductor pattern including an extension portion extending from the bonding portion toward the bypass capacitor and at least partially overlapping with the lower electrode, and the extension portion may have a section outside the lower electrode, the section being smaller in area than the overhang area of the lower electrode.

(3) In the optical module according to (2), the extension portion may include a pad bonded to the overlap area and a line connecting the bonding portion and the pad.

(4) The optical module according to (2) or (3) may further include a spacer between the overlap area of the lower electrode and the extension portion of the conductor pattern, the spacer electrically connecting the overlap area and the extension portion.

(5) An optical module includes: an optical semiconductor device in which a semiconductor laser and an optical modulator are integrated, the optical semiconductor device including an anode electrode of the semiconductor laser and an anode electrode of the optical modulator, the optical semiconductor device including a cathode electrode common to the semiconductor laser and the optical modulator; a bypass capacitor including a lower electrode and an upper electrode, the bypass capacitor being connected in parallel to the semiconductor laser; a dielectric substrate having an upper surface and a lower surface, the optical semiconductor device and the bypass capacitor being surface-mounted on the upper surface, the dielectric substrate having a conductor pattern on the upper surface, the cathode electrode and the lower electrode being bonded to the conductor pattern; a spacer between the bypass capacitor and the conductor pattern, the spacer electrically connecting the bypass capacitor and the conductor pattern; and a conductor block supporting the lower surface of the dielectric substrate. The conductor pattern includes a bonding portion bonded to the cathode electrode. The conductor pattern includes a pad bonded to the lower electrode. The lower electrode is larger in area than the pad.

The lower electrode of the bypass capacitor is away from the conductor block, thereby making a parasitic capacitance smaller to suppress a decrease in a characteristic impedance.

(6) In the optical module according to (4) or (5), the spacer may include an insulating substrate and a conductor penetrating the insulating substrate.

(7) In the optical module according to (4) or (5), the spacer may include an insulating substrate having a recess on a side surface and a castellation electrode in the recess.

(8) In the optical module according to (7), the castellation electrode may be bonded to the extension portion of the conductor pattern with gold-tin solder.

(9) In the optical module according to any one of (1) to (4), the entire lower surface of the dielectric substrate may be opposed and fixed to the conductor block.

(10) In the optical module according to any one of (1) to (4), the dielectric substrate may have a first portion fixed to the conductor block, and the dielectric substrate may have a second portion overhanging from the conductor block.

(11) In the optical module according to (10), the first portion and the second portion, of the dielectric substrate, may be adjacent to each other only in one direction.

(12) In the optical module according to (10), the first portion and the second portion, of the dielectric substrate, may be adjacent to each other in at least two intersecting directions.

(13) In the optical module according to any one of (10) to (12), the conductor block may have a first area and a second area on an upper surface, the second area may be lower than the first area, the first portion of the dielectric substrate may be fixed to the first area, and the second portion of the dielectric substrate may be spaced from and opposed to the second area.

(14) In the optical module according to (13), the overhang area of the lower electrode need not be opposed to the first area and may be spaced from and opposed to the second area.

(15) In the optical module according to any one of (10) to (12), the second portion of the dielectric substrate need not be opposed to the conductor block.

(16) In the optical module according to (15), the overhang area of the lower electrode need not be opposed to the conductor block.

DETAILED DESCRIPTION

Figure 1:
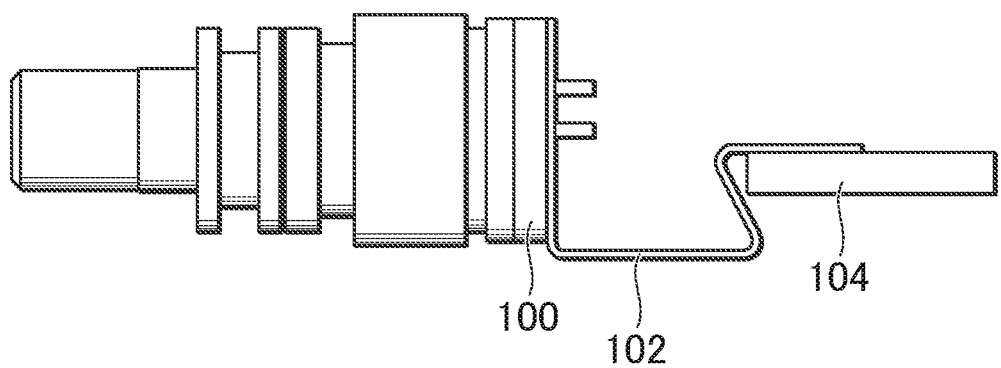
FIG. 1 is a perspective view of an optical module in a first embodiment.

Hereinafter, some embodiments will be described specifically and in detail with reference to drawings. In all the drawings, the members with the same reference numerals have the identical or same feature and their repetitive description will be omitted. Sizes of figures do not always comply with magnification.

First Embodiment

FIG. 1 is a perspective view of an optical module in a first embodiment. The optical module has an optical sub-assembly 100. The optical sub-assembly 100 is a transistor outline can (TO-CAN) type package and may be a transmitter optical sub-assembly (TOSA) including a light emitting device or a bidirectional optical sub-assembly (BOSA) including both a light emitting device and a light receiving device. The optical sub-assembly 100 is connected to a flexible substrate 102. The flexible substrate 102 is connected to a printed circuit board 104.

[Optical Semiconductor Device]

Figure 2:
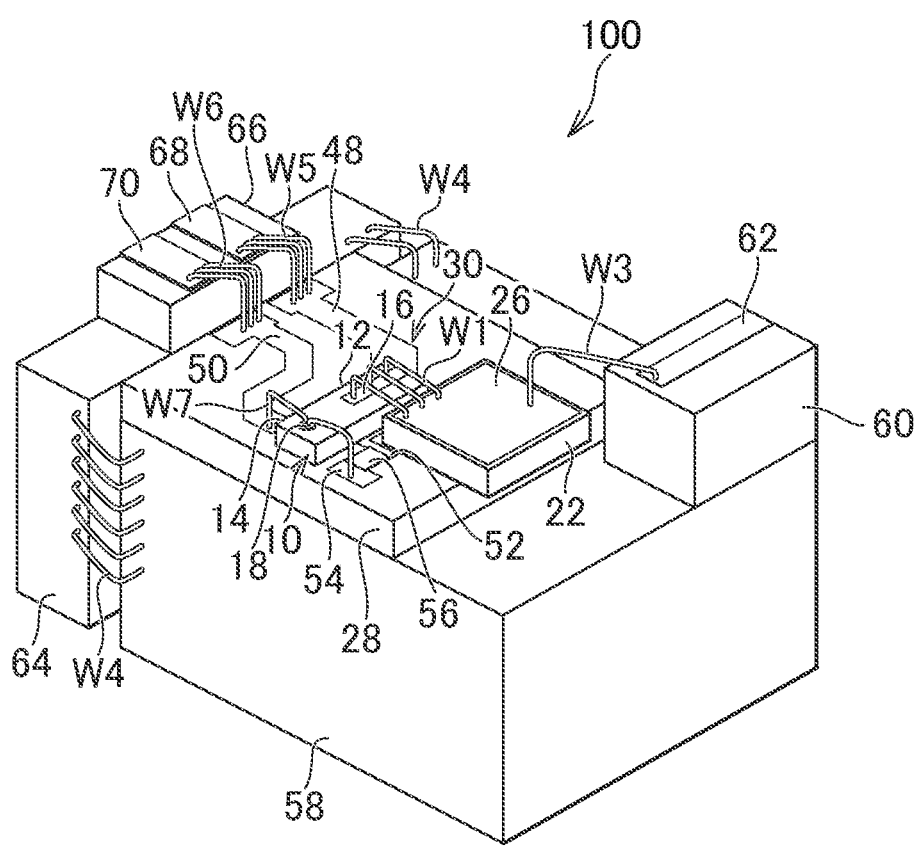
FIG. 2 is a perspective view of an internal structure of an optical sub-assembly in FIG. 1.
Figure 3:
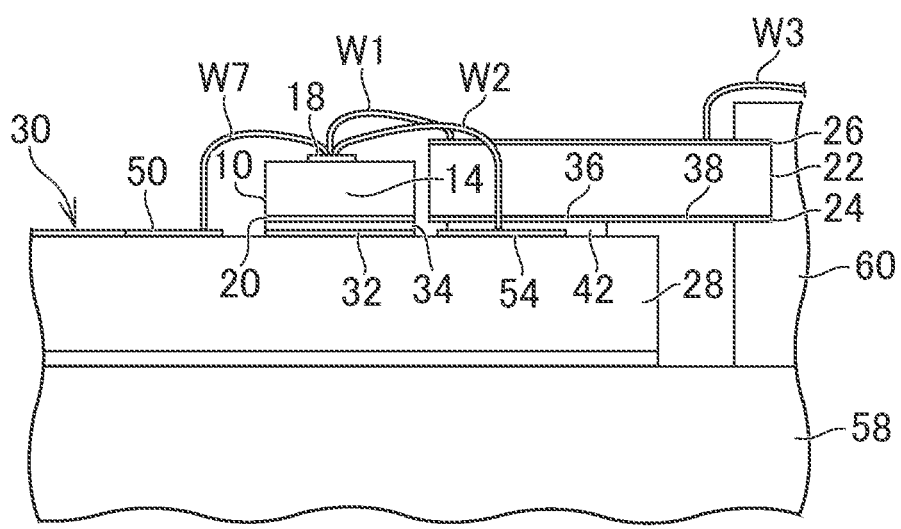
FIG. 3 is an enlarged side view of part of the structure in FIG. 2.

FIG. 2 is a perspective view of an internal structure of an optical sub-assembly 100 in FIG. 1. FIG. 3 is an enlarged side view of part of the structure in FIG. 2. The optical module has an optical semiconductor device 10. A semiconductor laser 12 and an optical modulator 14 are integrated in the optical semiconductor device 10. The optical semiconductor device 10 has an anode electrode 16 of the semiconductor laser 12. The optical semiconductor device 10 has an anode electrode 18 of the optical modulator 14. The optical semiconductor device 10 has a cathode electrode 20 (FIG. 3) that is common to the semiconductor laser 12 and the optical modulator 14.

[Bypass Capacitor]

The optical module has a bypass capacitor 22. The bypass capacitor 22 is a parallel plate capacitor, having a lower electrode 24 and an upper electrode 26. The upper electrode 26 is connected to the anode electrode 16 of the semiconductor laser 12 with one or more wires W1.

[Dielectric Substrate]

The optical module has a dielectric substrate 28. The dielectric substrate 28 is preferably excellent in thermal conductivity. The dielectric substrate 28 has an upper surface and a lower surface. The dielectric substrate 28 has a conductor pattern 30 on the upper surface. The optical semiconductor device 10 is surface-mounted on the upper surface of the dielectric substrate 28. The bypass capacitor 22 is surface-mounted on the upper surface of the dielectric substrate 28.

Figure 4:
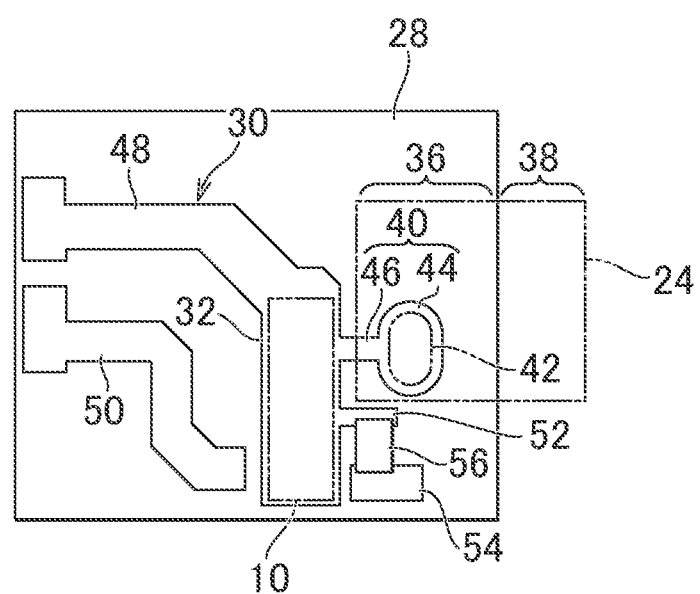
FIG. 4 is a plan view of a conductor pattern.

FIG. 4 is a plan view of a conductor pattern 30. The conductor pattern 30 includes a bonding portion 32 on which the optical semiconductor device 10 is mounted. The cathode electrode 20 in FIG. 3 is bonded to the conductor pattern 30 (bonding portion 32). A filler metal 34 (solder, brazing material) in FIG. 3 is used for bonding.

The bypass capacitor 22 is configured to partially protrude from the dielectric substrate 28. As shown in FIG. 4, the lower electrode 24 includes an overlap area 36 that overlaps with the upper surface of the dielectric substrate 28 and an overhang area 38 that protrudes from the upper surface of the dielectric substrate 28.

The conductor pattern 30 includes an extension portion 40 extending from the bonding portion 32 toward the bypass capacitor 22. The extension portion 40 at least partially overlaps with the lower electrode 24. The lower electrode 24 (at least part of the overlap area 36) is bonded to the conductor pattern 30. A filler metal 42 (solder, brazing material) is used for bonding. The extension portion 40 includes a pad 44 that is bonded to the overlap area 36 and a line 46 that connects the bonding portion and the pad 44. The extension portion 40 has a portion, outside the lower electrode 24 (without overlapping with the lower electrode 24), that is smaller in area than the overhang area 38 of the lower electrode 24. The lower electrode 24 is larger in area than the pad 44.

The conductor pattern 30 includes a first line portion 48 extending from the bonding portion 32. The first line portion 48 has an end portion on the side opposite to the bypass capacitor 22 (lower electrode 24). The conductor pattern 30 includes a second line portion 50 that is close to but not connected to the bonding portion 32. The second line portion 50 also has an end portion on the side opposite to the bypass capacitor 22 (lower electrode 24). The end portion of the first line portion 48 and the end portion of the second line portion 50 are adjacent to each other. The conductor pattern 30 includes a stub 52 extending from the bonding portion 32 and includes a land 54. A terminating resistor 56 is connected between the stub 52 and the land 54. The terminating resistor 56 is surface-mounted. The land 54, to which the terminating resistor 56 is connected, is connected to the anode electrode 18 of the optical modulator 14 with a wire W2. The terminating resistor 56 is connected in parallel to the optical modulator 14.

[Conductor Block]

The optical module has a conductor block 58. The dielectric substrate 28, at the lower surface, is supported (adheres) to the conductor block 58. The entire lower surface of the dielectric substrate 28 is opposed and fixed to the conductor block 58. The conductor block 58 is connected to a reference potential (e.g., ground). The conductor block 58 may be mounted on a thermoelectric cooler containing an unillustrated Peltier device.

A dielectric block 60, which is made of a dielectric such as glass, is mounted on the conductor block 58. A conductive layer 62 is on the dielectric block 60. The upper electrode 26 of the bypass capacitor 22 is connected to the conductive layer 62 of the dielectric block 60, with a wire W3.

A sub-conductor block 64 is arranged next to and spaced from the conductor block 58. The conductor block 58 and the sub-conductor block 64 are thermally separated. The sub-conductor block 64 is also connected to the reference potential (e.g., ground). The conductor block 58 is connected to the sub-conductor block 64 with one or more wires W4.

A sub-dielectric substrate 66 is mounted on the sub-conductor block 64. The sub-dielectric substrate 66 has a first conductive layer 68 and a second conductive layer 70, both of which are arranged next to each other. The first line portion 48 of the conductor pattern 30 is connected to the first conductive layer 68, with one or more wires W5. The second line portion 50 of the conductor pattern 30 is connected to the second conductive layer 70, with one or more wires W6. Additionally, the second line portion 50 is connected to the anode electrode 18 of the optical modulator 14, with a wire W7.

[Equivalent Circuit]

Figure 5:
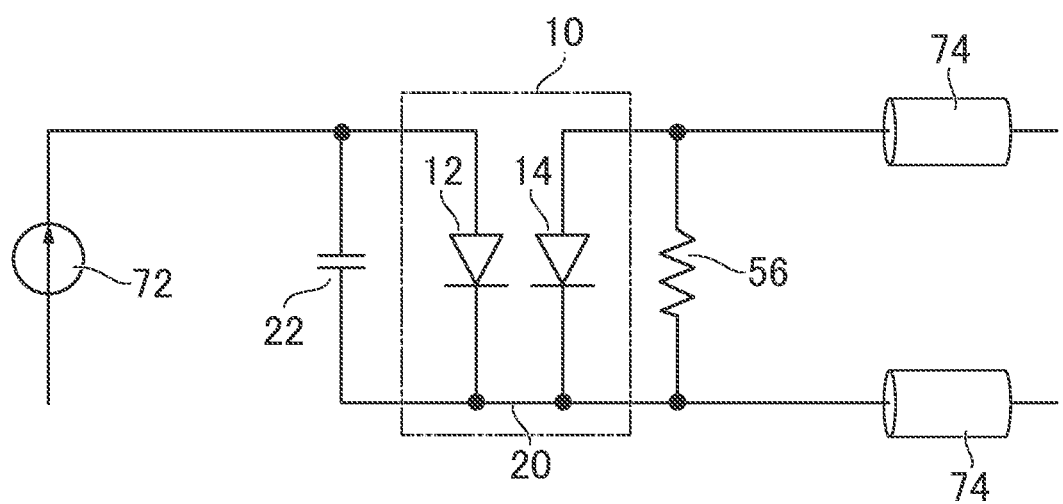
FIG. 5 is an equivalent circuit diagram of the optical module.

FIG. 5 is an equivalent circuit diagram of the optical module. A constant current is input from a current source 72 to the semiconductor laser 12. A differential signal pair (positive-phase signal and reverse-phase signal) is input to the optical modulator 14, through a pair of coaxial lines 74. The semiconductor laser 12 and the optical modulator 14 share the cathode electrode 20, whereas the bypass capacitor 22 is connected in parallel to the semiconductor laser 12. Thus, the differential signal pair bypasses the semiconductor laser 12 not to flow in it.

In this embodiment, the dielectric substrate 28 is not interposed between the overhang area 38 of the lower electrode 24 of the bypass capacitor 22 and the conductor block 58. The air between the overhang area 38 and the conductor block 58 is less in dielectric constant than the material (e.g., ceramic) of the dielectric substrate 28. This reduces a parasitic capacitance, suppressing a decrease in a characteristic impedance.

Second Embodiment

Figure 6:
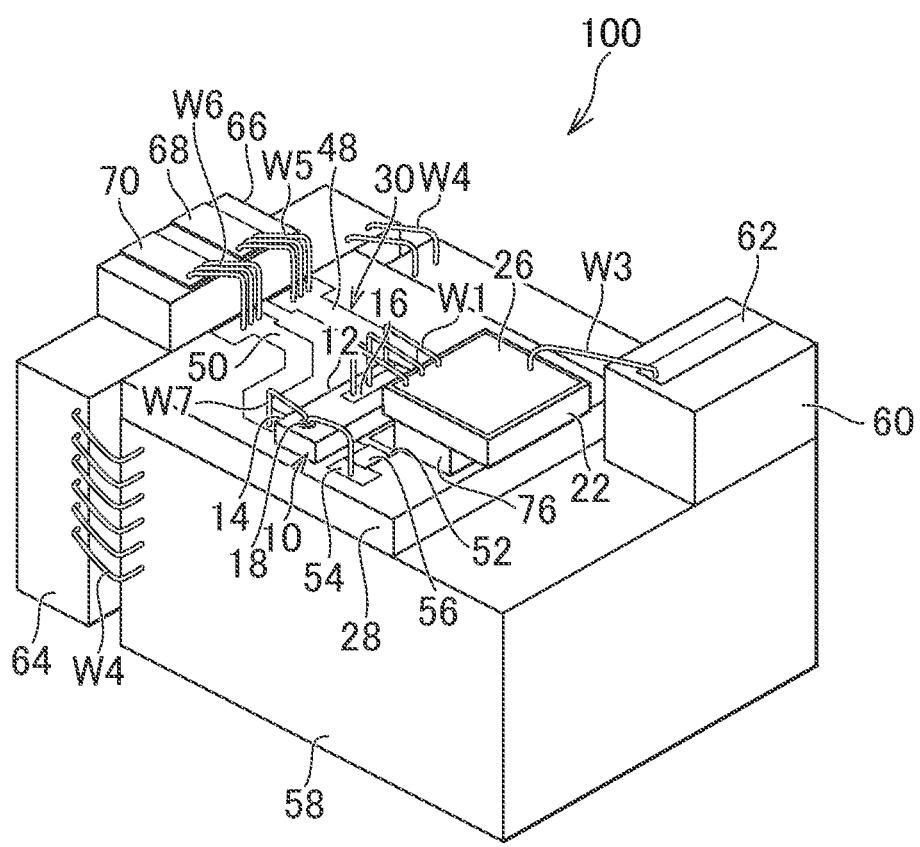
FIG. 6 is a perspective view of an internal structure of an optical sub-assembly in a second embodiment.

FIG. 6 is a perspective view of an internal structure of an optical sub-assembly in a second embodiment. The optical module has a spacer 76. This embodiment is the same as the first embodiment except for the spacer 76. The spacer 76 is interposed between the lower electrode 24 (overlap area 36) and the conductor pattern 30 (extension portion 40), to electrically connect them (see FIGS. 3 and 4).

Figure 7:
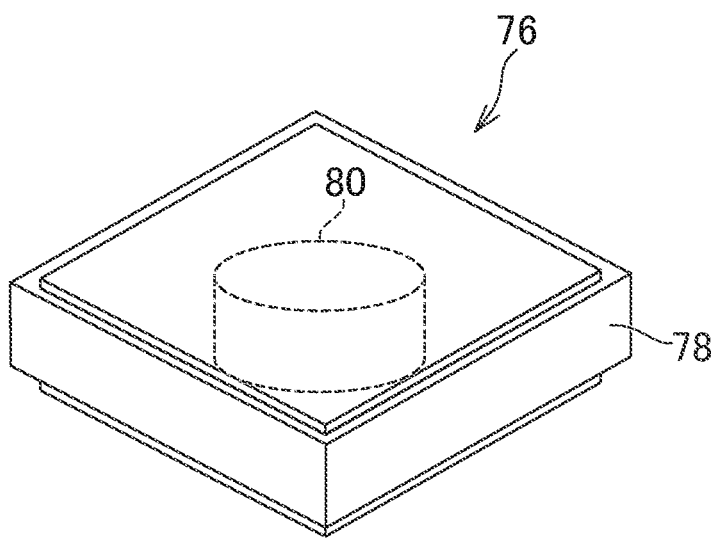
FIG. 7 is an enlarged perspective view of a spacer in FIG. 6.

FIG. 7 is an enlarged perspective view of the spacer 76 in FIG. 6. The spacer 76 includes an insulating substrate 78 and a conductor 80 penetrating the insulating substrate 78. The conductor 80 extends over an upper surface and a lower surface of the insulating substrate 78. The conductor 80 is smaller than the overlap area 36 of the lower electrode 24.

The spacer 76 raises the bypass capacitor 22 so that the overlap area 36 (portion protruding from the pad 44) of the lower electrode 24 is further away from the conductor block 58. This further reduces the parasitic capacitance, further suppressing the decrease in the characteristic impedance.

[Modification]

Figure 8:
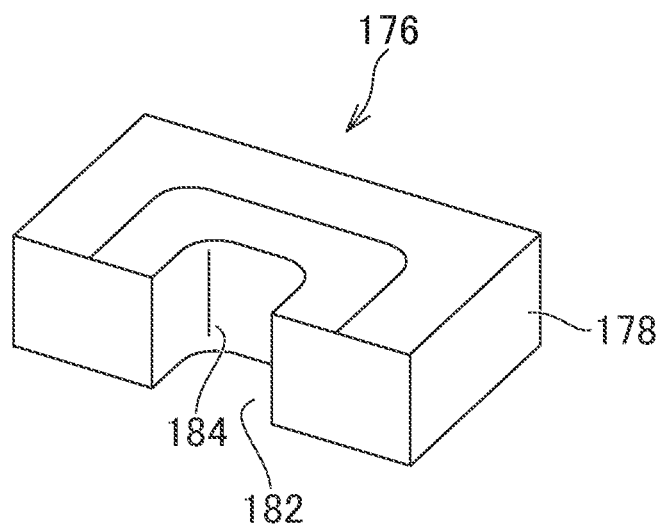
FIG. 8 is a perspective view of a spacer used in a modification.

FIG. 8 is a perspective view of a spacer used in a modification. The spacer 176 has an insulating substrate 178 with a recess 182 formed on a side surface. The spacer 176 includes a castellation electrode 184 in the recess 182. The castellation electrode 184 extends on the upper surface and the lower surface of the insulating substrate 178.

Figure 9:
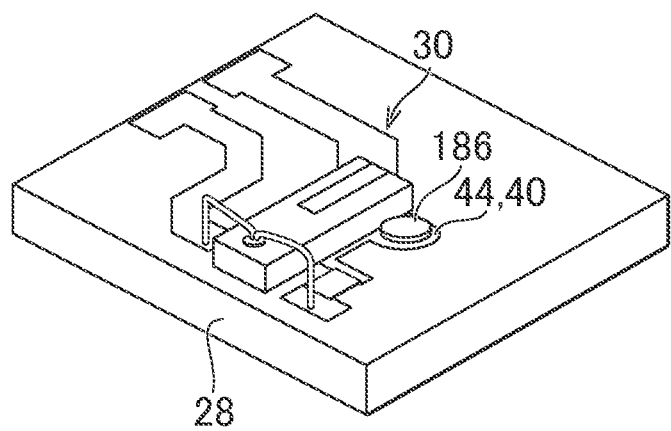
FIG. 9 is an explanatory diagram of a bonding process in the modification.

FIGS. 9 to 12 are explanatory diagrams of a bonding process in the modification. As shown in FIG. 9, gold-tin solder is provided on the pad 44 by vapor deposition.

Figure 10:
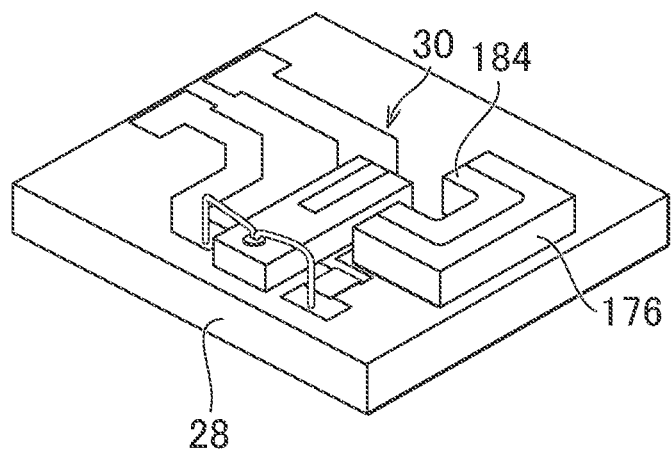
FIG. 10 is an explanatory diagram of the bonding process in the modification.

As shown in FIG. 10, the spacer 176 is bonded to the pad 44 with the deposited gold-tin solder 186. The gold-tin solder 186 melts by heating and spreads on the side surface of the castellation electrode 184 in the recess 182. This enables visual confirmation of electrical connection portion between the pad 44 and the spacer 176, to suppress the occurrence of defects. Further, the molten gold-tin solder 186 moves upward along the castellation electrode 184, preventing it from moving along the upper surface of the dielectric substrate 28, thereby suppressing an increase in parasitic capacitance.

The gold-tin solder 186 formed by the vapor deposition has lower fluidity when melted. Therefore, a collet (unillustrated) capable of adsorbing the spacer 176 is unlikely to suck the molten solder, preventing the collet from being damaged. The castellation electrode 184 is bonded to the extension portion 40 (pad 44) of the conductor pattern 30, with the gold-tin solder 186, without flux.

Figure 11:
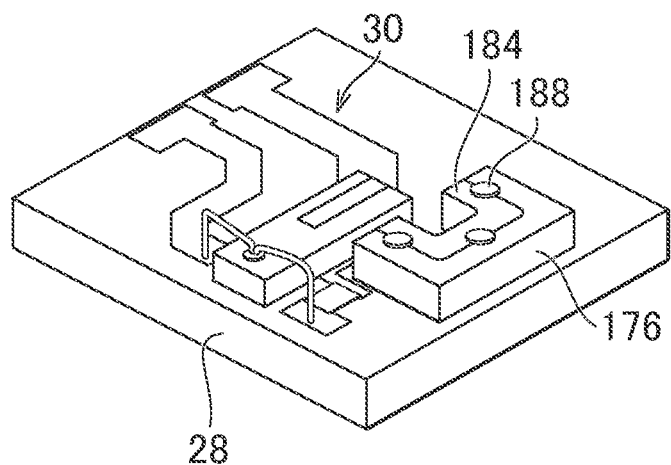
FIG. 11 is an explanatory diagram of the bonding process in the modification.
Figure 12:
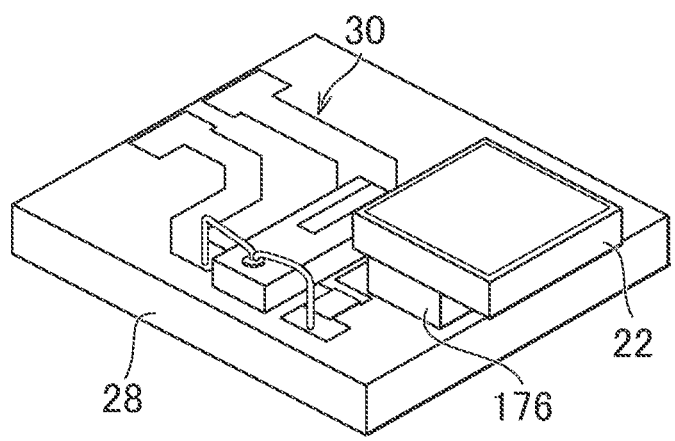
FIG. 12 is an explanatory diagram of the bonding process in the modification.

As shown in FIG. 11, a conductive adhesive 188 is provided on the spacer 176. The conductive adhesive 188 is provided on the castellation electrode 184 on the upper surface of the insulating substrate 178. As shown in FIG. 12, the bypass capacitor 22 is bonded to the spacer 176.

Third Embodiment

Figure 13:
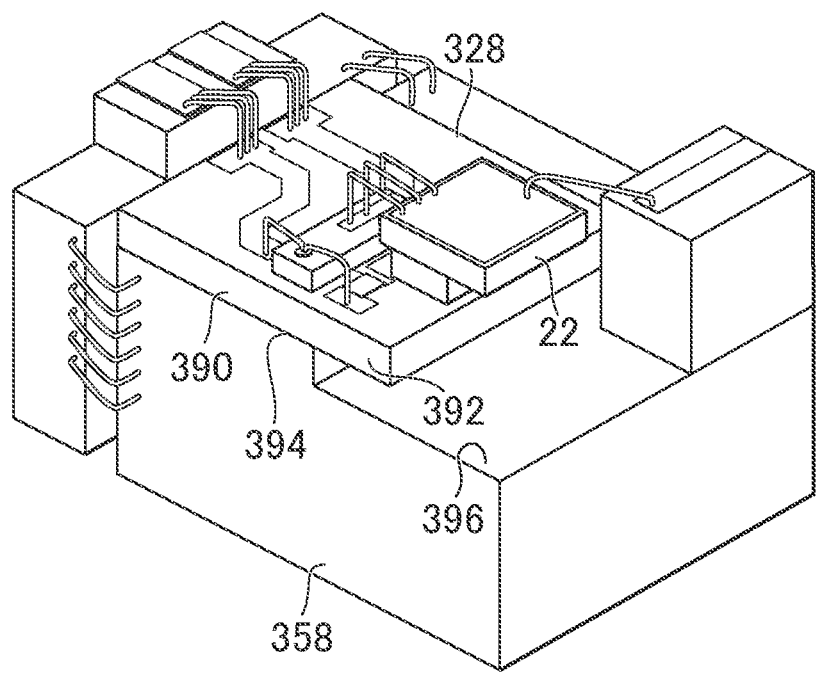
FIG. 13 is a perspective view of an internal structure of an optical sub-assembly in a third embodiment.
Figure 14:
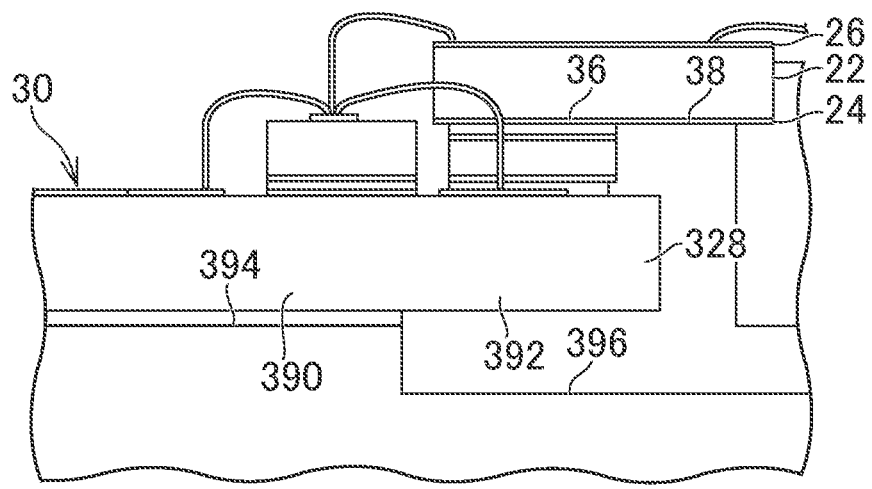
FIG. 14 is an enlarged side view of part of the structure in FIG. 13.

FIG. 13 is a perspective view of an internal structure of an optical sub-assembly in a third embodiment. FIG. 14 is an enlarged side view of part of the structure in FIG. 13. The first portion 390 of the dielectric substrate 328 is fixed to the conductor block 358. The second portion 392 of the dielectric substrate 328 overhangs from the conductor block 358. The first portion 390 and the second portion 392 of the dielectric substrate 328 are adjacent to each other only in one direction.

The conductor block 358 has a first area 394 and a second area 396 on the upper surface. The second area 396 is lower than the first area 394. The first portion 390 of the dielectric substrate 328 is fixed to the first area 394. The second portion 392 of the dielectric substrate 328 is spaced from and opposed to the second area 396. The overhang area 38 of the lower electrode 24 of the bypass capacitor 22 is not opposed to the first area 394 but is spaced from and opposed to the second area 396.

In this embodiment, the second area 396 is low, whereby the overlap area 36 of the lower electrode 24 is further away from the conductor block 358. This makes the parasitic capacitance further lower, further suppressing the decrease in the characteristic impedance.

The pad 44 (refer to FIG. 4) of the conductor pattern 30 is above the second area 396, without overlapping with the first area 394. The lower electrode 24 of the bypass capacitor 22 is above the second area 396, without overlapping with the first area 394. The pad 44 and the lower electrode 24 are spaced from the conductor block 358. Air is interposed between the pad 44 and the conductor block 358. This makes the parasitic capacitance further lower, further suppressing the decrease in the characteristic impedance.

Fourth Embodiment

Figure 15:
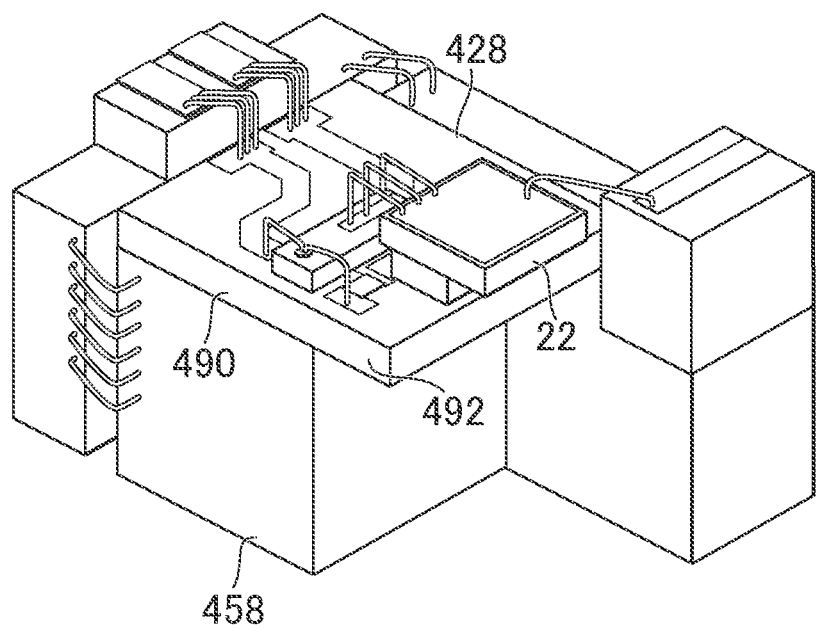
FIG. 15 is a perspective view of an internal structure of an optical sub-assembly in a fourth embodiment.
Figure 15:
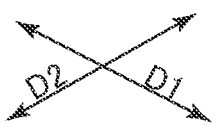

FIG. 15 is a perspective view of an internal structure of an optical sub-assembly in a fourth embodiment. The first portion 490 of the dielectric substrate 428 is fixed to the conductor block 458. The second portion 492 of the dielectric substrate 428 overhangs from the conductor block 458. The second portion 492 of the dielectric substrate 428 is not opposed to the conductor block 458. The overhang area 38 (refer to FIG. 4) of the lower electrode 24 of the bypass capacitor 22 is not opposed to the conductor block 458. This makes the parasitic capacitance further lower, further suppressing the decrease in the characteristic impedance.

The first portion 490 and the second portion 492 of the dielectric substrate 428 are adjacent to each other in at least two intersecting directions (the first direction D1 and the second direction D2 shown in FIG. 15). Thus, the dielectric substrate 428 is unlikely to tilt. In this regard, in the third embodiment, the boundary between the first portion 490 and the second portion 492 is straight, whereby the dielectric substrate 328 is likely to tilt. With respect to other points, the contents described in the third embodiment are applicable hereto.

Figure 16:
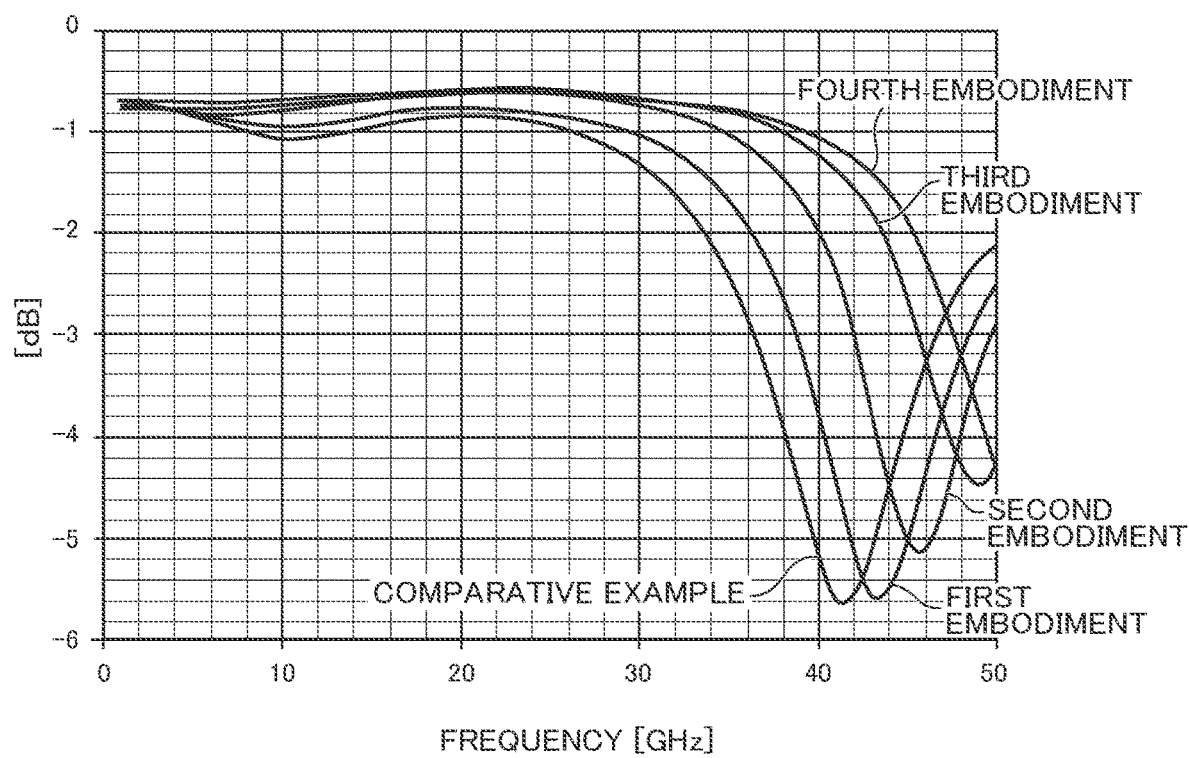
FIG. 16 is a diagram of frequency characteristics obtained by simulation using a three-dimensional electric field analysis tool.

FIG. 16 is a diagram of frequency characteristics obtained by simulation using a three-dimensional electric field analysis tool. The frequency characteristics are transmission characteristics of the differential signal pair. In the comparative example, the entire lower electrode of the bypass capacitor overlaps with the dielectric substrate. It can be seen that the smaller the parasitic capacitance is, the better the transmission characteristics are.

The embodiments described above are not limited and different variations are possible. The structures explained in the embodiments may be replaced with substantially the same structures and other structures that can achieve the same effect or the same objective.

What is claimed is:

1. An optical module comprising:
an optical semiconductor device in which a semiconductor laser and an optical modulator are integrated, the optical semiconductor device including an anode electrode of the semiconductor laser and an anode electrode of the optical modulator, the optical semiconductor device including a cathode electrode common to the semiconductor laser and the optical modulator;
a bypass capacitor including a lower electrode and an upper electrode, the bypass capacitor being connected in parallel to the semiconductor laser;
a dielectric substrate having an upper surface and a lower surface, the optical semiconductor device and the bypass capacitor being surface-mounted on the upper surface, the dielectric substrate having a conductor pattern on the upper surface, the cathode electrode and the lower electrode being bonded to the conductor pattern; and
a conductor block supporting the lower surface of the dielectric substrate,
the lower electrode of the bypass capacitor having an overlap area overlapping with the upper surface of the dielectric substrate, the lower electrode of the bypass capacitor having an overhang area overhanging from the upper surface of the dielectric substrate.

2. The optical module according to claim 1, wherein the conductor pattern includes a bonding portion bonded to the cathode electrode, the conductor pattern including an extension portion extending from the bonding portion toward the bypass capacitor and at least partially overlapping with the lower electrode, and
the extension portion has a section outside the lower electrode, the section being smaller in area than the overhang area of the lower electrode.

3. The optical module according to claim 2, wherein the extension portion includes a pad bonded to the overlap area and a line connecting the bonding portion and the pad.

4. The optical module according to claim 2, further comprising a spacer between the overlap area of the lower electrode and the extension portion of the conductor pattern, the spacer electrically connecting the overlap area and the extension portion.

5. The optical module according to claim 4, wherein the spacer includes an insulating substrate and a conductor penetrating the insulating substrate.

6. The optical module according to claim 4, wherein the spacer includes an insulating substrate having a recess on a side surface and a castellation electrode in the recess.

7. The optical module according to claim 6, wherein the castellation electrode is bonded to the extension portion of the conductor pattern with gold-tin solder.

8. The optical module according to claim 1, wherein the entire lower surface of the dielectric substrate is opposed and fixed to the conductor block.

9. The optical module according to claim 1, wherein
the dielectric substrate has a first portion fixed to the conductor block, and
the dielectric substrate has a second portion overhanging from the conductor block.

10. The optical module according to claim 9, wherein the first portion and the second portion, of the dielectric substrate, are adjacent to each other only in one direction.

11. The optical module according to claim 9, wherein the first portion and the second portion, of the dielectric substrate, are adjacent to each other in at least two intersecting directions.

12. The optical module according to claim 9, wherein
the conductor block has a first area and a second area on an upper surface, the second area being lower than the first area,
the first portion of the dielectric substrate is fixed to the first area, and
the second portion of the dielectric substrate is spaced from and opposed to the second area.

13. The optical module according to claim 12, wherein the overhang area of the lower electrode is not opposed to the first area and is spaced from and opposed to the second area.

14. The optical module according to claim 9, wherein the second portion of the dielectric substrate is not opposed to the conductor block.

15. The optical module according to claim 14, wherein the overhang area of the lower electrode is not opposed to the conductor block.

16. An optical module comprising:
- an optical semiconductor device in which a semiconductor laser and an optical modulator are integrated, the optical semiconductor device including an anode electrode of the semiconductor laser and an anode electrode of the optical modulator, the optical semiconductor device including a cathode electrode common to the semiconductor laser and the optical modulator;
- a bypass capacitor including a lower electrode and an upper electrode, the bypass capacitor being connected in parallel to the semiconductor laser;
- a dielectric substrate having an upper surface and a lower surface, the optical semiconductor device and the bypass capacitor being surface-mounted on the upper surface, the dielectric substrate having a conductor pattern on the upper surface, the cathode electrode and the lower electrode being bonded to the conductor pattern;
- a spacer between the bypass capacitor and the conductor pattern, the spacer electrically connecting the bypass capacitor and the conductor pattern; and
- a conductor block supporting the lower surface of the dielectric substrate, the conductor pattern including a bonding portion bonded to the cathode electrode, the conductor pattern including a pad bonded to the lower electrode, the lower electrode being larger in area than the pad.

17. The optical module according to claim 16, wherein the spacer includes an insulating substrate and a conductor penetrating the insulating substrate.

18. The optical module according to claim 16, wherein the spacer includes an insulating substrate having a recess on a side surface and a castellation electrode in the recess.

19. The optical module according to claim 18, wherein the castellation electrode is bonded to the conductor pattern with gold-tin solder.

* * * * *